(12) United States Patent
Kojo et al.

(10) Patent No.: US 8,710,718 B2
(45) Date of Patent: Apr. 29, 2014

(54) SEALING MEMBER FOR PIEZOELECTRIC RESONATOR DEVICE, AND PIEZOELECTRIC RESONATOR DEVICE

(75) Inventors: Takuya Kojo, Kakogawa (JP); Kenji Moriguchi, Kakogawa (JP); Ryuji Matsuo, Kakogawa (JP); Tetsuya Hanaki, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 74 days.

(21) Appl. No.: 13/497,827

(22) PCT Filed: May 27, 2011

(86) PCT No.: PCT/JP2011/062181
§ 371 (c)(1),
(2), (4) Date: Mar. 23, 2012

(87) PCT Pub. No.: WO2011/149043
PCT Pub. Date: Dec. 1, 2011

(65) Prior Publication Data
US 2012/0262030 A1    Oct. 18, 2012

(30) Foreign Application Priority Data
May 28, 2010 (JP) ................................. 2010-123239

(51) Int. Cl.
*H01L 41/053* (2006.01)
(52) U.S. Cl.
USPC ........................................................ 310/348

(58) Field of Classification Search
USPC .................................................. 310/344, 348
See application file for complete search history.

(56) References Cited

U.S. PATENT DOCUMENTS 6,433,466 B2 * 8/2002 Wajima ......................... 310/344

FOREIGN PATENT DOCUMENTS

| JP | 2004-303822 A | 10/2004 |
| JP | 2008-206002 A | 9/2008 |
| JP | 2009-055354 A | 3/2009 |
| JP | 2009-246696 A | 10/2009 |
| JP | 2010-103749 A | 5/2010 |
| JP | 2010-119057 A | 5/2010 |

* cited by examiner

*Primary Examiner* — Derek Rosenau
(74) *Attorney, Agent, or Firm* — Marvin A. Motsenbocker; MOTS LAW, PLLC (57) ABSTRACT

A sealing member is for a piezoelectric resonator device that includes a piezoelectric resonator piece and a plurality of sealing members hermetically sealing a resonance region of the piezoelectric resonator piece. The sealing member includes a base material having one principal surface and includes a protruding portion on the one principal surface. The base material has another principal surface having a flat surface and a curved surface. The flat surface is a region corresponding to the protruding portion. The curved surface is a region other than the region of the flat surface. The sealing member includes a plurality of external terminals on the flat surface. The plurality of external terminals are to be connected to an external circuit board. The sealing member includes a plurality of inspection terminals on the curved surface. The plurality of inspection terminals is configured to inspect the piezoelectric resonator piece.

7 Claims, 10 Drawing Sheets

SEALING MEMBER FOR PIEZOELECTRIC RESONATOR DEVICE, AND PIEZOELECTRIC RESONATOR DEVICE

TECHNICAL FIELD

The present invention relates to a sealing member for a piezoelectric resonator device, and a piezoelectric resonator device.

BACKGROUND ART

Piezoelectric resonator devices hermetically seal excitation electrodes of piezoelectric resonator pieces, which are configured to effect piezoelectric resonance. Examples of the piezoelectric resonator devices include crystal oscillators.

Crystal oscillators each include a package defined by a base made of a ceramic material in the form of a box and a single plate lid made of a metallic material. In the internal space of the package, a piezoelectric resonator piece and an IC chip are held by and bonded to the base. The bonding of the base and the lid hermetically seals the piezoelectric resonator piece and the IC chip in the internal space (see, for example, patent document 1).

The crystal oscillator described in patent document 1 uses a base that includes two box bodies of ceramic materials that are layered one on top of one another by integral firing. The piezoelectric resonator piece is mounted on one of the box bodies of the base, while the IC chip is mounted on the other box body. The crystal oscillator includes, on the rear surface (other principal surface) of the base: external terminals to be electrically connected to an external circuit board; and inspection terminals to measure and inspect the properties of the crystal resonator piece. The external terminals and the inspection terminals are formed along the outer periphery of the other principal surface.

Bases made of box bodies of ceramic materials, such as the one shown in patent document 1, are formed by integral firing, and this causes a state in which stress remains in the bases after fired (the stress being referred to as residual stress).

The base with residual stress has a flat surface across a corresponding region corresponding to a wall portion of the base that is in the form of box bodies, whereas other regions have a surface that is convexly or concavely curved due to residual stress (the other regions being, specifically, the regions on the other principal surface corresponding to a cavity on the one principal surface of the base).

CITATION LIST

Patent Literature

Patent document 1: Japanese Unexamined Patent Application Publication No. 2009-246696.

SUMMARY OF INVENTION

Technical Problem

Incidentally, crystal oscillators such as the one described in patent document 1 are mounted on external circuit boards with a conductive bonding material such as solder by pressing the crystal oscillators onto the external circuit boards. In this respect, the pressing force against the crystal oscillator causes the conductive bonding material to be pressed to expand over the flat surface of the other principal surface of the base (over the corresponding region of the other principal surface, which corresponds to the wall portion). The conductive bonding material causes connection between the external terminals and the inspection terminals arranged along the outer periphery of the flat surface of the other principal surface. This results in a short circuit between the external terminals and the inspection terminals.

In order to solve the above-described problems, it is an object of the present invention to provide a piezoelectric resonator device and a sealing member for the piezoelectric resonator device that prevent a short circuit between external terminals and inspection terminals associated with the bonding of the piezoelectric resonator device to an external circuit board with a conductive bonding material such as solder.

Solution to Problem

In order to achieve the above-described object, according to one aspect of the present invention, a sealing member is for a piezoelectric resonator device that includes a piezoelectric resonator piece and a plurality of sealing members hermetically sealing a resonance region of the piezoelectric resonator piece. The sealing member includes a base material having one principal surface and includes a protruding portion on the one principal surface. The base material has another principal surface having a flat surface and a curved surface. The flat surface is a region corresponding to the protruding portion. The curved surface is a region other than the region of the flat surface. The sealing member includes a plurality of external terminals on the flat surface. The plurality of external terminals are to be connected to an external circuit board. The sealing member includes a plurality of inspection terminals on the curved surface. The plurality of inspection terminals is configured to inspect the piezoelectric resonator piece.

With this aspect of the present invention, at the time of connecting of the sealing member to the external circuit board with the conductive bonding material such as solder, a short circuit between the external terminals and the inspection terminals is prevented. Specifically, the other principal surface of the base material has a flat surface as a region corresponding to the protruding portion and a curved surface as a region other than the flat surface. The plurality of external terminals are disposed on the flat surface, while the plurality of inspection terminals are disposed on the curved surface. This ensures that at the time of connecting of the sealing member to the external circuit board, the conductive bonding material such as solder expands over the corresponding region of the other principal surface having the flat surface, and does not expand to the curved surface, which is the region other than the corresponding region. As a result, no connection occurs between the external terminals on the flat surface and the inspection terminals on the curved surface. This prevents a short circuit between the external terminals and the inspection terminals.

The inspection terminals are disposed on the region other than the corresponding region corresponding to the protruding portion of the other principal surface. This ensures that even if a bonding layer of conductive material is disposed on the top surface of the protruding portion for the purpose of bonding a plurality of sealing members, the bonding layer and the inspection terminals do not produce a large capacitance. This, as a result, prevents a reduction of negative resistance of the piezoelectric resonator device and a reduction of capacitance of a piezoelectric resonator device having a variable capacitance.

In the above configuration, the base material may have a plurality of via holes passing through between both principal surfaces of the base material. An alignment of the plurality of via holes may be inclined relative to any side of the other principal surface.

With this configuration, the alignment of the plurality of via holes is inclined relative to any side of the other principal surface. This ensures that when stress applies along the directions of the sides of the other principal surface associated with hermetic seal of the sealing member, the vector of the stress between the plurality of via holes is diminished. This, as a result, minimizes the occurrence of a crack in a portion of poor strength between the plurality of via holes.

In the above configuration, the protruding portion may be a wall portion. The wall portion may be a part defining an outer shape of the sealing member.

With this configuration, the protruding portion is the wall portion that is a part defining the outer shape of the sealing member. This ensures the disposition of the external terminals on the outer shape of the sealing member, where the sealing member has high mechanical strength. This, as a result, realizes the mounting of the sealing member to the external circuit board in a mechanically and electrically stable state.

In the above configuration, the sealing member may further include an insulating portion including an insulating material over the inspection terminals.

With this configuration, the insulating portion prevents the inspection terminals from being exposed after the production of the piezoelectric resonator device. This prevents contact of the inspection terminals with a terminal of another electronic device.

In the above configuration, the sealing member may further include a pair of recognition portions for image recognition on the one principal surface of the base material. The pair of recognition portions may serve as an electrode.

This case ensures that the piezoelectric resonator piece is mounted on the sealing member with the recognition portions serving as a mounting basis for mounting the piezoelectric resonator piece on the sealing member. This, as a result, reduces misaligned mounting of the piezoelectric resonator piece on the sealing member, and facilitates the attempt to improve productivity, such as improving the yield.

In the above configuration, the sealing member may further include a pillow portion on the one principal surface of the base material. The pillow portion may be dedicated to the piezoelectric resonator piece and to image recognition.

This case ensures that the piezoelectric resonator piece is mounted on the sealing member with the pillow portions serving as a mounting basis for mounting the piezoelectric resonator piece on the sealing member. This, as a result, reduces misaligned mounting of the piezoelectric resonator piece on the sealing member, and facilitates the attempt to improve productivity, such as improving the yield.

In order to achieve the above-described object, according to another aspect of the present invention, a piezoelectric resonator device includes the sealing member according to the one aspect of the present invention and the above-described piezoelectric resonator piece.

With this aspect of the present invention, the sealing member according to the one aspect of the present invention and the above-described piezoelectric resonator piece are provided. This provides similar advantageous effects to those of the sealing member according to the one aspect of the present invention. This also prevents a short circuit between the external terminals and the inspection terminals at the time of connecting of the piezoelectric resonator device to the external circuit board with the conductive bonding material such as solder.

In the above configuration, the sealing member may further include an integrated circuit element on the sealing member. A gap between the sealing member and the integrated circuit elements may be equal to or less than 50 μm. A gap between the sealing member and the piezoelectric resonator piece may be larger than the gap between the sealing member and the integrated circuit element.

In this case, the gap between the sealing member and the integrated circuit elements is equal to or less than 50 μm. The gap between the sealing member and the piezoelectric resonator piece is larger than the gap between the sealing member and the integrated circuit elements. This makes the integrated circuit element serve as a barrier to prevent contact of the piezoelectric resonator piece with the sealing member.

Advantageous Effects of Invention

The aspects of the present invention prevent a short circuit between the external terminals and the inspection terminals at the time of connecting of the piezoelectric resonator device to the external circuit board with the conductive bonding material such as solder.

DESCRIPTION OF EMBODIMENTS

Embodiments of the present invention will be described below by referring to the accompanying drawings. In the following embodiments, the present invention is applied to a crystal resonator piece as a piezoelectric resonator piece and applied to a crystal oscillator as a piezoelectric resonator device.

Embodiment 1

Figure 1:
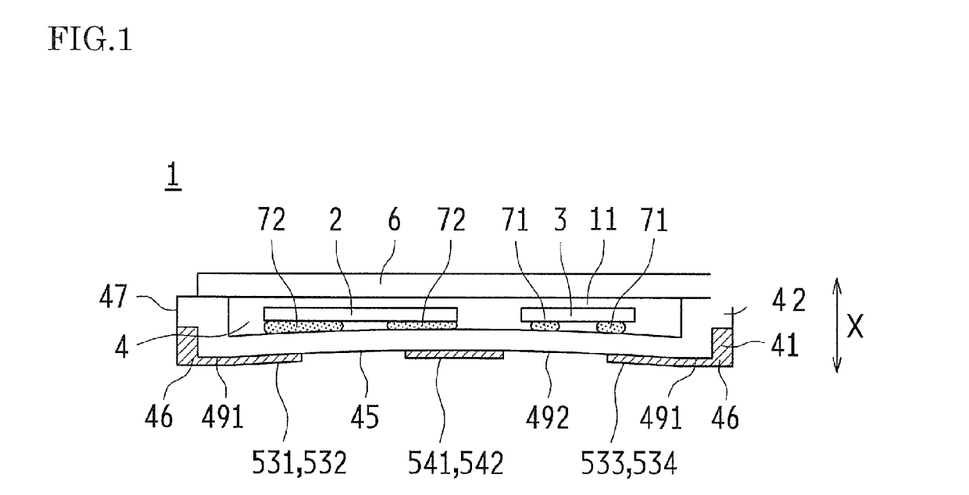
FIG. 1 is a schematic side view of a crystal oscillator according to embodiment 1, for illustrating an internal space of the crystal oscillator.
Figure 2:
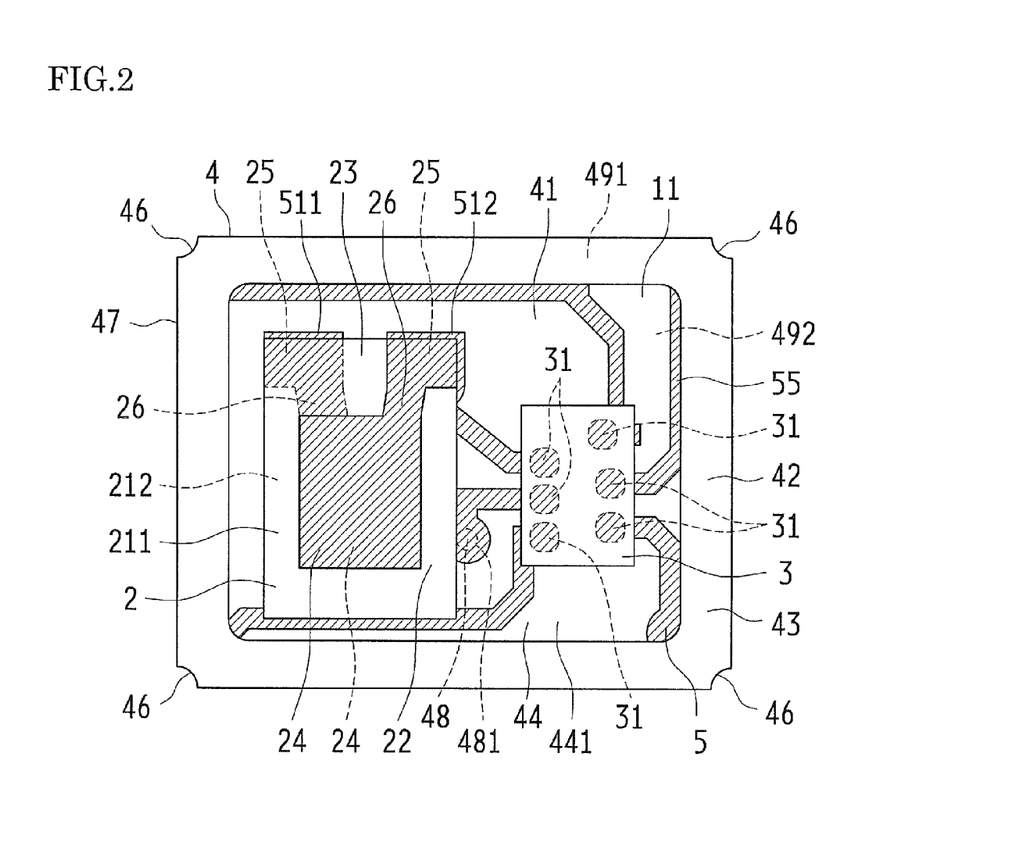
FIG. 2 is a schematic plan view of a base according to embodiment 1 with a crystal resonator piece and an IC chip mounted on the base.

As shown in FIGS. 1 and 2, a crystal oscillator 1 according to this embodiment includes: a crystal resonator piece 2 (piezoelectric resonator piece) that is configured to effect piezoelectric resonance; an IC chip 3 (electronic component element) that is a single chip integrated circuit element constituting an oscillation circuit with the crystal resonator piece 2; a base 4 (sealing member) that holds and mounts the crystal resonator piece 2 and the IC chip 3 to hermetically seal the crystal resonator piece 2 and the IC chip 3; and a lid 6 (sealing member) opposed to the base 4 to hermetically seal the crystal resonator piece 2 and the IC chip 3 held and mounted in the base 4.

The crystal oscillator 1 includes a package defined by the base 4 and the lid 6. The base 4 and the lid 6 are bonded to one another with a bonding material (not shown) to define a hermetically sealed internal space 11. In the internal space 11, the IC chip 3 is electrically and mechanically bonded to the base 4 with a conductive bump 71 by ultrasonic bonding of Flip Chip Bonding (FCB). The IC chip 2 is also electrically and mechanically bonded to the base 4 with a conductive bonding material 72. In this embodiment, the conductive bump 71 uses a metal bump such as a Au bump. The conductive bonding material 72 uses a conductive resin adhesive such as silicone, a metal bump such as a Au bump, or a plating bump. The bonding material uses Ag brazing filler metal, Ni plating, Sn alloy such as a Au/Sn alloy, or glass material.

Next, the constituents of the crystal oscillator 1 will be described below by referring to FIGS. 1 to 4.

The crystal resonator piece 2 is a substrate made of a AT-Cut crystal piece, and as shown in FIG. 2, has an outer shape in the form of a single plate of rectangular parallelepiped with both principal surfaces 211 and 212 having approximately rectangular shapes.

The crystal resonator piece 2 includes a resonance portion 22 that constitutes a resonance region, and a bonding portion 23 that is bonded to electrode pads 511 and 512 of the base 4, which are external electrodes. The resonance portion 22 and the bonding portion 23 are integrally formed. The resonance portion 22 and the bonding portion 23 have the same thickness. While in this embodiment the resonance portion 22 and the bonding portion 23 have the same thickness, this should not be construed in a limiting sense; the resonance portion 22 may be thinner so as to adapt to high frequency applications.

The crystal resonator piece 2 includes: a pair of excitation electrodes 24 for effecting excitation; a pair of terminal electrodes 25 electrically and mechanically bonded to the electrode pads 511 and 512 of the base 4; and leading-out electrodes 26 leading out the pair of the excitation electrodes 24 to the pair of terminal electrodes 25. The leading-out electrodes 26 lead the pair of respective excitation electrodes 24 to electrically connect the pair of respective excitation electrodes 24 to the pair of respective terminal electrodes 25.

The pair of excitation electrodes 24 are disposed to correspond to a center of both principal surfaces 211 and 212 of the resonance portion 22 in plan view. The pair of excitation electrodes 24 are each made of, for example, a Cr/Au film, which includes a Cr layer and an Au layer that are stacked in the order set forth starting on the substrate.

The pair of terminal electrodes 25 are disposed on the other principal surface 212 of the bonding portion 23. The pair of terminal electrodes 25 are disposed adjacent to and covering one side of the substrate in the longer side direction. The pair of terminal electrodes 25 are each made of, for example, a Cr/Au film, which includes a Cr layer and an Au layer that are stacked in the order set forth starting on the substrate, similarly to the excitation electrodes 24.

The pair of leading-out electrodes 26 are disposed on the resonance portion 22 and the bonding portion 23. The pair of leading-out electrodes 26 extend from the resonance portion 22 to the bonding portion 23. The pair of leading-out electrodes 26 are formed on both principal surfaces 211 and 212 of the crystal resonator piece 2 without mutual correspondence (opposition). The leading-out electrodes 26 are each made of, for example, a Cr/Au film, which includes a Cr layer and an Au layer that are stacked in the order set forth starting on the substrate, similarly to the excitation electrodes 24.

The base 4 is made of a base material of ceramic material such as alumina. As shown in FIGS. 1 to 4, the base 4 is in the form of a box including a bottom portion 41 and a wall portion 42 (protruding portion of the present invention) that extends upward from the bottom portion 41 along an outer periphery of the one principal surface 43 of the base 4. The base 4 includes a plurality of annular plates of ceramic (corresponding to the wall portion 42) and a conductive material of an electrode 5 (see below) on a single plate of ceramic (corresponding to the bottom portion 41). The plurality of annular plates and the electrode 5 are layered one on top of another and integrally fired into a depressed shape (in cross-sectional view).

The base 4 has a top surface on the wall portion 42 as a bonding surface with respect to the lid 6. The bonding surface includes a first bonding layer (not shown) to be bonded to the lid 6. The first bonding layer has a layer structure of a plurality of layers on the top surface of the wall portion 42 of the base 4, including a metallized layer (not shown) such as of W or Mo, a Ni film of nickel, and a Au film of gold, which are layered in the order set forth. The metallized layer is integrated at the time of the ceramic firing after printing of metallization materials. The Ni film and the Au film are formed by plating technology.

The base 4 has a cavity 44 of rectangular shape in plan view on the one principal surface 43. The cavity 44 is surrounded by the bottom portion 41 and the wall portion 42. The cavity 44 has a bottom face 441 on which the crystal resonator piece 2 and the IC chip 3 are mounted side by side.

Figure 4:
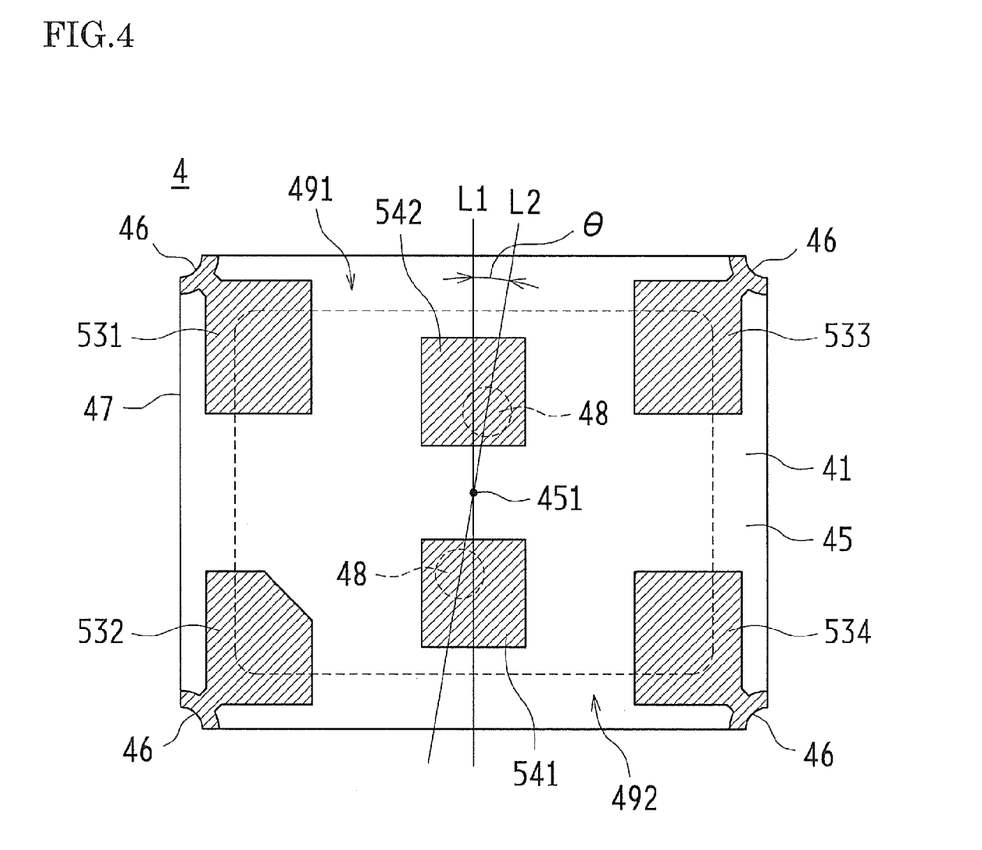
FIG. 4 is a schematic rear view of the base according to embodiment
Figure 5:
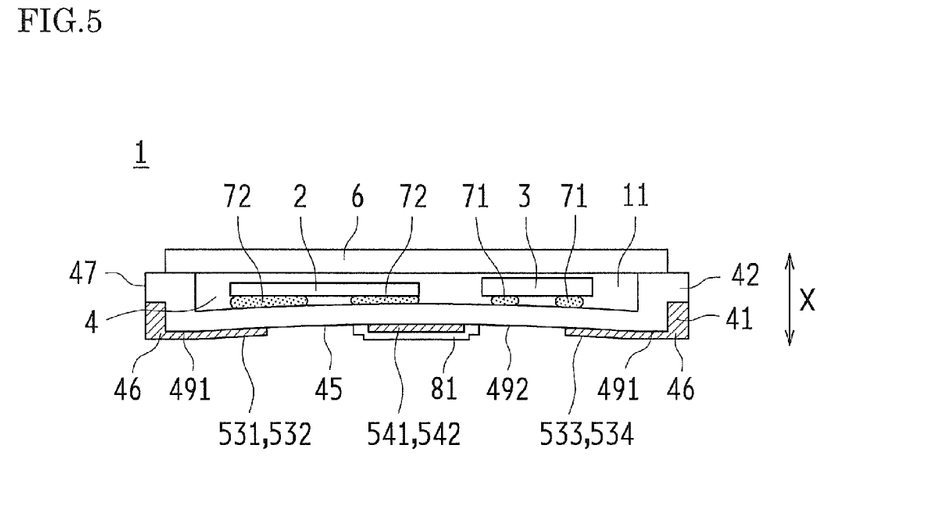
FIG. 5 is a schematic side view of the crystal oscillator according to embodiment 2, for illustrating an internal space of the crystal oscillator.

As shown in FIG. 4, the base 4 includes a casing and castellations 46 formed on the four corners of the rear surface (the other principal surface 45) of the casing. The castellations 46 are each in the form of an arc-shaped cutout (half-circle depressed portion), and extend in the vertical direction (X direction along the height of the base 4 shown in FIG. 1) on a side surface 47 of the casing.

Figure 3:
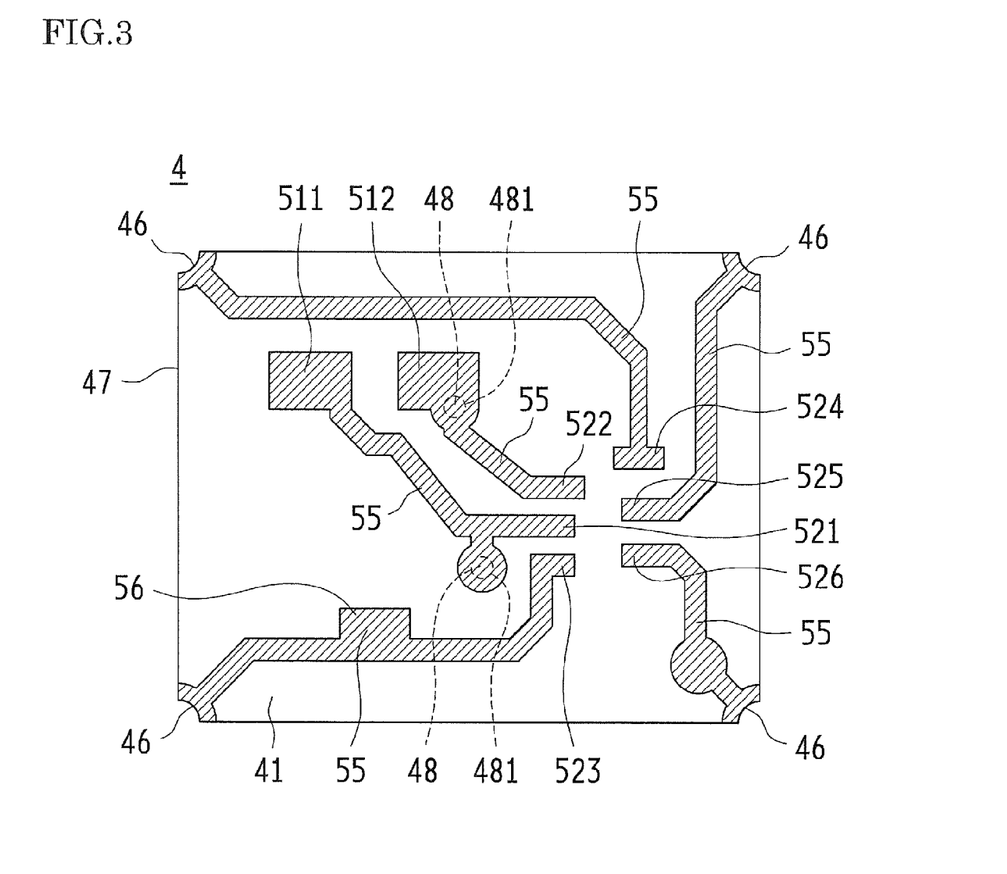
FIG. 3 is a schematic plan view of the base (bottom portion) according to embodiment 1, for illustrating electrode patterns.

As shown in FIGS. 2 to 4, the base 4 has two via holes 48 that lead out the excitation electrodes 24 of the crystal resonator piece 2 from the interior of the cavity 44 to outside the cavity 44. The via holes 48 are each filled with a conducting member 481 of Cu, W, Mo, or the like.

The two via holes 48 pass through between both principal surfaces 43 and 45 of the base 4. The via holes 48 are inclined relative to any side of the base 4 and aligned to form an inclination in a direction (see a line L2 in FIG. 4) at angle θ (5 to 30 degrees) relative to the shorter side direction of the base (see line L1 in FIG. 4). The via holes 48 are mutually symmetrical relative to a center point 451 of the other principal surface 45. The two via holes 48 are disposed in a region other than a corresponding region on the other principal surface 45 that corresponds to the wall portion 42 on the one principal surface 43 (the corresponding region being hereinafter referred to as wall portion corresponding region 491). That is, the two via holes 48 are disposed in a region on the other principal surface 45 that corresponds to the bottom face 441 of the cavity 44 on the one principal surface 43 (the corresponding region being hereinafter referred to as cavity corresponding region 492).

As shown in FIGS. 2 to 4, the electrode 5 of the base 4 includes: a pair of electrode pads 511 and 512 that are electrically and mechanically bonded to the respective excitation electrodes 24 of the crystal resonator piece 2; connection pads 521, 522, 523, 524, 525, and 526 that are electrically connected to respective terminals 31 of the IC chip 3; external terminals 531, 532, 533, and 534 that are to be electrically connected to an external device such as an external circuit board (not shown) with a conductive bonding material such as solder (not shown); and inspection terminals 541 and 542 that measure and inspect the properties of the crystal resonator piece 2.

The electrode pads 511 and 512 and the connection pads 521, 522, 523, 524, 525, and 526 are disposed on a common plane, on the bottom face 441 of the cavity 44 of the one principal surface 43 of the base 4 (specifically, on the bottom portion 41 of the base 4).

The external terminals 531, 532, 533, and 534 are disposed in the wall portion corresponding region 491 of the other principal surface 45 (outer periphery of the other principal surface 45), and partly disposed in the cavity corresponding region 492 of the other principal surface 45 (center position with the outer periphery of the other principal surface 45 excluded). Specifically, the external terminals 531, 532, 533, and 534 are disposed on the corners and the castellations 46 of the other principal surface 45. While in this embodiment the external terminals 531, 532, 533, and 534 are partly disposed in the cavity corresponding region 492, this should not be construed in a limiting sense. All that is necessary is that the external terminals 531, 532, 533, and 534 be disposed in the wall portion corresponding region 491 of the other principal surface 45 (the outer periphery of the other principal surface 45). It is also possible to dispose the external terminals 531, 532, 533, and 534 only in the wall portion corresponding region 491 of the other principal surface 45.

The inspection terminals 541 and 542 are disposed only in the cavity corresponding region 492 of the other principal surface 45 (center position with the outer periphery of the other principal surface 45 excluded). Specifically, the inspection terminals 541 and 542 are disposed at a center position of the other principal surface 45 in the longer side direction and disposed side by side along the shorter side direction of the other principal surface 45. Under the inspection terminals 541 and 542, the respective via holes 48 are disposed.

The electrode pads 511 and 512, the connection pads 521 and 522, and the inspection terminals 541 and 542 in the above-described configuration are electrically connected to each other via the via holes 48 and wiring patterns 55. The connection pads 523, 524, 525, and 526 and the external terminals 531, 532, 533, and 534 are electrically connected to each other via the wiring patterns 55.

The wiring pattern 55 that connects the connection pad 523 to the external terminal 531 includes a pillow portion 56 dedicated to the crystal resonator piece 2. The pillow portion 56 is continuous to the wiring pattern 55.

The electrode 5 of the base 4 is integrally fired with the base 4 after printing of metallization materials such as W, Mo, or the like. Among the electrode 5, the electrode pads 511 and 512, the connection pads 521, 522, 523, 524, 525, and 526, the external terminals 531, 532, 533, and 534, and the inspection terminals 541 and 542 have nickel platings formed over the respective metallized layers and gold platings formed over the respective nickel platings. Examples of the method of plating include electrolytic plating and non-electrolytic plating.

As shown in FIG. 1, the lid 6 is made of a metallic material and is in the form of a rectangular parallelepiped single plate. On the bottom face of the lid 6, a bonding material such as a Ag brazing filler metal (not shown) to be bonded to the base 4 is formed. The lid 6 is bonded to the base 4 by seam welding, thus forming the package of the crystal oscillator 1 defined by the lid 6 and the base 4.

As shown in FIG. 2, in the crystal oscillator 1 in the above-described configuration, the IC chip 3 is disposed on the bottom face 441 of the cavity 44 of the base 4. The IC chip 3 is electrically and mechanically bonded to the connection pads 521, 522, 523, 524, 525, and 526 via the conductive bumps 71 by ultrasonic bonding of FCB. The crystal resonator piece 2 is arranged side by side with the IC chip 3 on the bottom face 441 of the cavity 44 of the base 4, and electrically and mechanically bonded to the electrode pads 511 and 512 via the conductive bonding material 72.

Then, the lid 6 is disposed on the base 4 with the IC chip 3 and the crystal resonator piece 2 mounted on the common plane of the bottom face 441 of the cavity 44. Then, seam sealing is carried out in a nitrogen atmosphere, which includes sweeping a seam roller (not shown) along the shorter side of the package (the base 4, the lid 6) in plan view, thus melting the first bonding layer and the bonding material. The seam roller (not shown) then sweeps the package (the base 4, the lid 6) along the longer side of the package in plan view, thus melting the first bonding layer and the bonding material. The seam sealing implements the bonding between the bonding material on the lid 6 and the first bonding layer on the base 4. Thus, the crystal oscillator 1 with the crystal resonator piece 2 and the IC chip 3 hermetically sealed as shown in FIG. 1 is fabricated. The crystal oscillator 1 thus fabricated is mounted on an external circuit board with a conductive bonding material such as solder. In the crystal oscillator 1 thus fabricated, the gap between the lid 6 and the IC chip 3 is equal to or less than approximately 50 µm. The gap between the lid 6 and the crystal resonator piece 2 is larger than the gap between the lid 6 and the IC chip 3. In this embodiment, the gap between the lid 6 and the IC chip 3 is 50 µm, while the gap between the lid 6 and the crystal resonator piece 2 is 100 µm.

As described above, with the crystal oscillator 1 and the base 4 of the crystal oscillator 1 according to this embodiment, the base 4 is only of two-layer configuration of the bottom portion 41 and the wall portion 42. This accommodates lowered height applications of the crystal oscillator 1.

At the time of connecting of the crystal oscillator 1 (the base 4) to the external circuit board with the conductive bonding material such as solder, a short circuit between the external terminals 531, 532, 533, and 534 and the inspection terminals 541 and 542 is prevented. Specifically, the other principal surface 45 of the base 4 has a flat surface as the wall portion corresponding region 491 that corresponds to the wall portion 42, and a curved surface as the cavity corresponding region 492, which is other than the flat surface. The external terminals 531, 532, 533, and 534 are disposed on the flat surface, while the inspection terminals 541 and 542 are disposed on the curved surface. This ensures that at the time of connecting of the crystal oscillator 1 (the base 4) to the external circuit board, the conductive bonding material such as solder expands over the wall portion corresponding region 491 of the other principal surface 45 having the flat surface, and does not expand to the curved surface, which is the cavity corresponding region 492. As a result, no connection occurs between the external terminals 531, 532, 533, and 534 on the flat surface and the inspection terminals 541 and 542 on the curved surface. This prevents a short circuit between the external terminals 531, 532, 533, and 534 and the inspection terminals 541 and 542. In this embodiment, a dimension of height in X direction from the flat surface of the wall portion corresponding region 491 to the summit of the curved surface of the cavity corresponding region 492 is equal to or less than approximately 30 μm.

The inspection terminals 541 and 542 are disposed in the cavity corresponding region 492 of the other principal surface 45. This ensures that even if the first bonding layer of conductive material is disposed on the top surface of the wall portion 42 for the purpose of bonding the base 4 and the lid 6, the first bonding layer and the inspection terminals 541 and 542 do not produce a large capacitance. This, as a result, prevents a reduction of negative resistance of the crystal oscillator 1 and a reduction of capacitance of a crystal oscillator 1 having a variable capacitance.

As described in this embodiment, the external terminals 531, 532, 533, and 534 are at least partly disposed in the wall portion corresponding region 491 of the other principal surface 45, which provides the above-described advantageous effects.

The alignment of the two via holes 48 is inclined relative to any side of the other principal surface 45. This ensures that when stress applies along the directions of the sides of the other principal surface 45 associated with hermetic seal of the base 4 with the lid 6, the vector of the stress between the two via holes 48 is diminished. This, as a result, decreases the occurrence of a crack in a portion of poor strength between the two via holes 48. The via holes 48 may be formed not only for the purpose of leading out the inspection terminals but also for the purpose of leading out the external terminals 531, 532, 533, and 534, which are partially extended to the cavity corresponding region 492.

The protruding portion is the wall portion 42 that is a part defining the outer shape of the base 4. This ensures the disposition of the external terminals 531, 532, 533, and 534 on the outer shape of the base 4, where the base 4 has high mechanical strength. This, as a result, realizes the mounting of the base 4 to the external circuit board in a mechanically and electrically stable state.

The crystal resonator piece 2 and the IC chip 3 are disposed in parallel on the base 4. This makes the distance between the crystal resonator piece 2 and the base 4 equal to the distance between the IC chip 3 and the base 4, compared with a vertically arranged structure (a layer-arranged structure) in which the distance between the crystal resonator piece 2 and the base 4 is not equal to the distance between the IC chip 3 and the base 4. This ensures uniform conduction of external heat (such as heat conducted from the mounting board to the base 4) to the crystal resonator piece 2 and the IC chip 3. In particular, the crystal resonator piece 2 and the IC chip 3 are preferably disposed on a uniform thick part of the substrate of the base 4. Locating the crystal resonator piece 2 and IC chip 3 farther away from one another, compared with the vertically arranged structure, reduces the influence of heat from the IC chip 3 in oscillation to the crystal resonator piece 2. The crystal oscillator 1 according to this embodiment is useful in not only in SPXO but also in, for example, TCXO.

In this embodiment, the gap between the lid 6 and the IC chip 3 is 50 μm, while the gap between the lid 6 and the crystal resonator piece 2 is 100 μm. This ensures that even if the lid of the oscillator is subjected to some pressing force at the time of mounting to the board, the IC chip 3 serves as a support for the lid 6 to prevent the lid 6 from contacting the crystal resonator piece 2.

While in this embodiment the crystal oscillator is applied as the piezoelectric resonator device, this should not be construed in a limiting sense. Preferable piezoelectric resonator devices are those that hermetically seal the excitation electrodes of piezoelectric resonator pieces, which effect piezoelectric resonance. Examples of the piezoelectric resonator devices include piezoelectric resonators, piezoelectric filters, and surface acoustic wave devices.

While in this embodiment two via holes 48 are disposed in the base 4, this should not be construed in a limiting sense; any suitable number of via holes 48 may be selected.

While in this embodiment the package of the crystal oscillator 1 is defined by the base 4 having the protruding portion and the lid 6 in the form of a single plate, this should not be construed in a limiting sense. Insofar as the base 4 has a protruding portion, the package of the oscillator may be of a sandwich structure in which the base 4, the crystal resonator piece 2, and the lid 6 are layered.

While in this embodiment the present invention is applied to the base 4, this should not be construed in a limiting sense; the present invention may also be applied to the lid 6, in which case the protruding portion (the wall portion 42) and the electrode 5 are disposed in the lid 6.

While in this embodiment the bonding material is formed on the lid 6 prior to the bonding of the base 4 and the lid 6, this should not be construed in a limiting sense; the bonding material may also be formed on the base 4.

While in this embodiment the resonance portion 22 and the bonding portion 23 have the same thickness, this should not be construed in a limiting sense; the resonance portion 22 may be thinner so as to adapt to high frequency applications.

While in this embodiment the inspection terminals 541 and 542 are disposed side by side along the shorter side direction of the base 4, this should not be construed in a limiting sense; the inspection terminals 541 and 542 may be disposed side by side along the longer side direction of the base 4.

While in this embodiment the wall portion 42 is employed as the protruding portion, this should not be construed in a limiting sense; any other configuration is possible insofar as the protruding portion is on the one principal surface 43 of the base 4. For example, if a step portion is provided on the cavity 44 of the one principal surface 43 of the base 4, the step portion may be employed as the protruding portion.

In this embodiment, the gap between the lid 6 and the IC chip 3 is 50 μm, while the gap between the lid 6 and the crystal resonator piece 2 is 100 μm. This, however, should not be construed in a limiting sense. All that is necessary is that the gap between the lid 6 and the IC chip 3 be equal to or less than 50 μm, and that the gap between the lid 6 and the crystal resonator piece 2 be larger than the gap between the lid 6 and the IC chip 3. Accordingly, no gap (0 μm) may exist between the lid 6 and the IC chip 3, while a gap may exist between the lid 6 and the crystal resonator piece 2. For example, the lower surface of the lid 6 facing the base 4 may have a flat surface, and the upper surface of the IC chip 3 may contact the lower surface of the lid 6. The lid 6 may also be curved toward the base 4 side, or the lower surface of the lid 6 may be convexly curved, and the upper surface of the IC chip 3 may contact the lower surface of the lid 6. This efficiently discharges heat of the IC chip 3 to outside the oscillator 1 through the lid 6, which is effective for stable operation of the oscillator 1. This is also an optimal configuration for EMI prevention.

Embodiment 2

Next, a crystal oscillator 1 according to embodiment 2 will be described below by referring to the accompanying drawings. The crystal oscillator 1 according to embodiment 2 is different from embodiment 1 in the base 4. Accordingly, where embodiment 2 has a configuration in common with embodiment 1, the advantageous effects and modifications of the configuration of embodiment 2 are similar to the advantageous effects and the modifications of embodiment 1. In view of this, in embodiment 2, description will be given with regard to the base 4 in different respects from embodiment 1, while the other respects that are shared in common will not be elaborated.

As shown in FIGS. 5 to 8, the electrode 5 of the base 4 includes: a pair of electrode pads 511 and 512 that are electrically and mechanically bonded to the respective excitation electrodes 24 of the crystal resonator piece 2; connection pads 521, 522, 523, 524, 525, and 526 that are electrically connected to respective terminals 31 of the IC chip 3; external terminals 531, 532, 533, and 534 that are to be electrically connected to an external device such as an external circuit board (not shown) with a conductive bonding material such as solder (not shown); and inspection terminals 541 and 542 that measure and inspect the properties of the crystal resonator piece 2.

Figure 7:
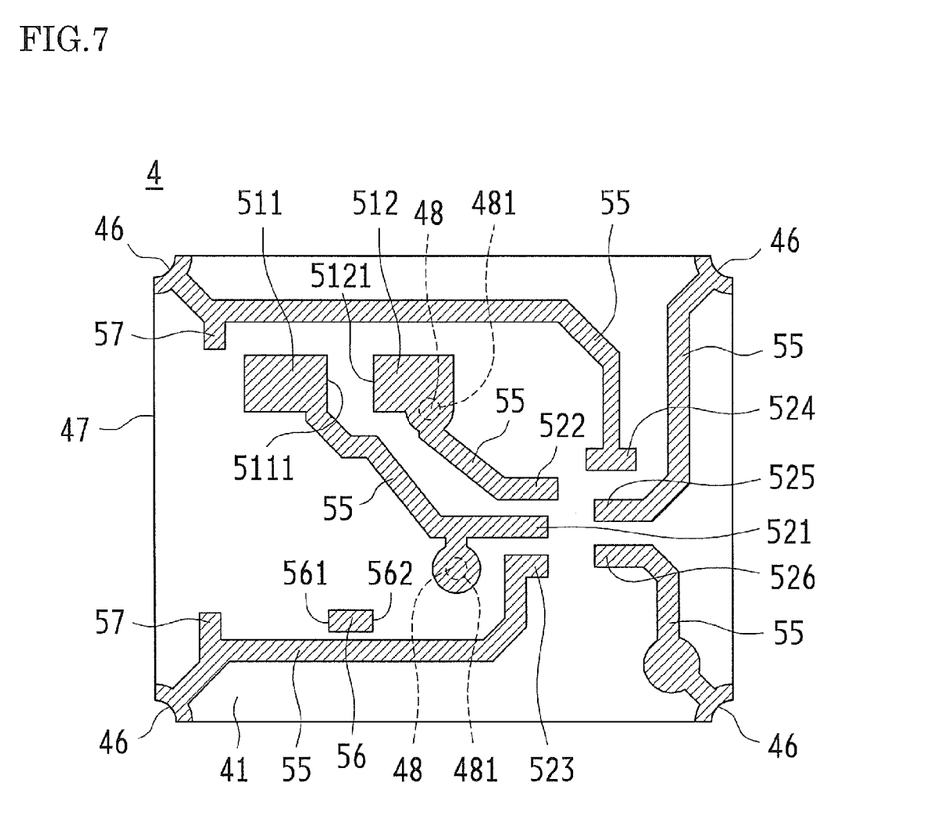
FIG. 7 is a schematic plan view of the base (bottom portion) according to embodiment 2, for illustrating electrode patterns.

The electrode pads 511 and 512 and the connection pads 521, 522, 523, 524, 525, and 526 are disposed on a common plane, on the bottom face 441 of the cavity 44 of the one principal surface 43 of the base 4 (specifically, on the bottom portion 41 of the base 4).

Figure 8:
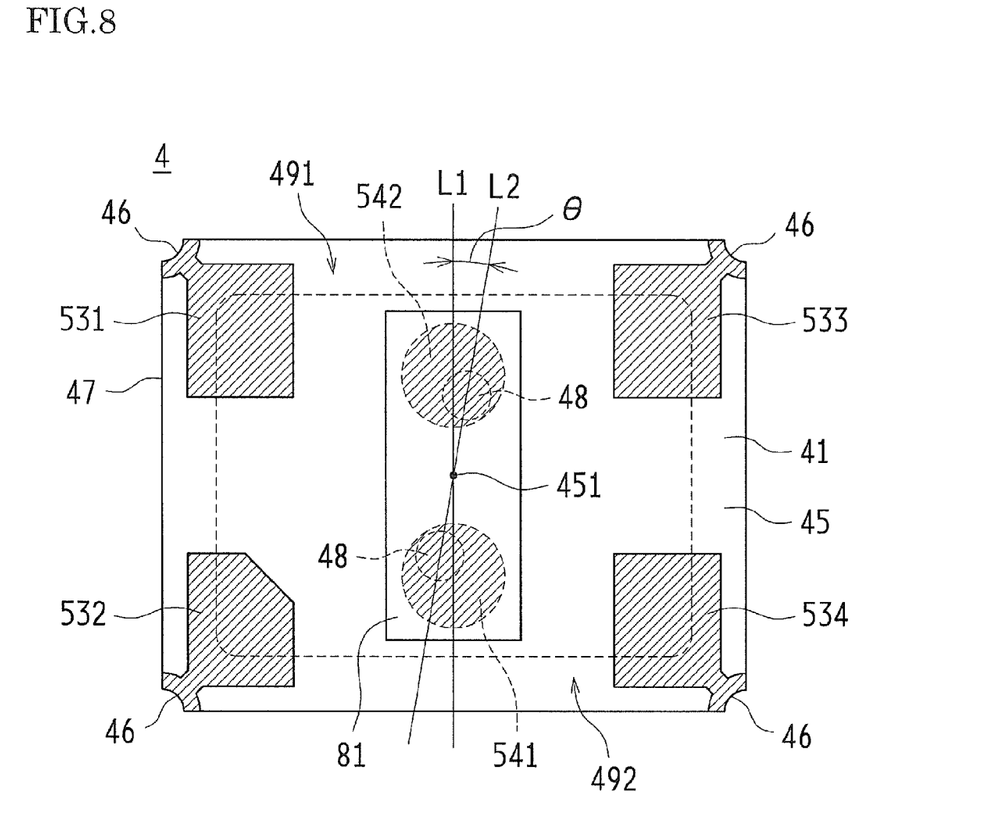
FIG. 8 is a schematic rear view of the base according to embodiment 2.

The external terminals 531, 532, 533, and 534 are disposed in the wall portion corresponding region 491 of the other principal surface 45 (outer periphery of the other principal surface 45), and partly disposed in the cavity corresponding region 492 of the other principal surface 45 (center position with the outer periphery of the other principal surface 45 excluded). Specifically, the external terminals 531, 532, 533, and 534 are disposed on the corners and the castellations 46 of the other principal surface 45. While in this embodiment the external terminals 531, 532, 533, and 534 are partly disposed in the cavity corresponding region 492, this should not be construed in a limiting sense. All that is necessary is that the external terminals 531, 532, 533, and 534 be disposed in the wall portion corresponding region 491 of the other principal surface 45 (the outer periphery of the other principal surface 45). It is also possible to dispose the external terminals 531, 532, 533, and 534 only in the wall portion corresponding region 491 of the other principal surface 45.

The inspection terminals 541 and 542 are disposed only in the cavity corresponding region 492 of the other principal surface 45 (center position with the outer periphery of the other principal surface 45 excluded), and are circular shaped in plan view as shown in FIG. 8. Specifically, the inspection terminals 541 and 542 are disposed at a center position of the other principal surface 45 in the longer side direction and disposed side by side along the shorter side direction of the other principal surface 45. Under the inspection terminals 541 and 542, the respective via holes 48 are disposed. Each via hole 48 is deviated from the center of the inspection terminal 541 or 542. An insulating portion 81 of insulating material such as resist is disposed over the inspection terminals 541 and 542. The insulating portion 81 prevents exposure of the inspection terminals 541 and 542 after the fabrication of the crystal oscillator 1, and thus prevents contact of the inspection terminals 541 and 542 with a terminal of another electronic device. This eliminates the need for forming the base 4 into a depressed shape (depressed portion 82), as described in embodiment 3 below (see FIG. 9). This prevents contact of the inspection terminals 541 and 542 with a terminal of another electronic device without degrading the strength of the base 4. The insulating portion 81 is not limited to this embodiment; any other materials and shapes may be selected insofar as the inspection terminals 541 and 542 are covered with the insulating portion 81.

The electrode pads 511 and 512, the connection pads 521 and 522, and the inspection terminals 541 and 542 in the above-described configuration are electrically connected to each other via the via holes 48 and wiring patterns 55. The connection pads 523, 524, 525, and 526 and the external terminals 531, 532, 533, and 534 are electrically connected to each other via the wiring patterns 55.

Figure 6:
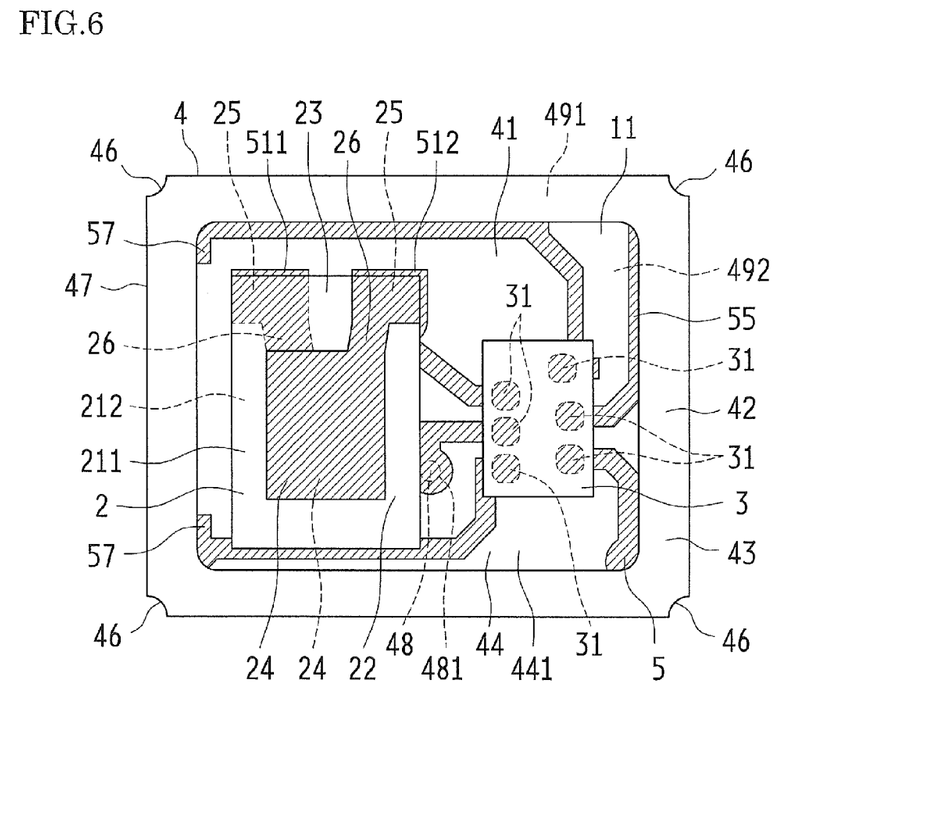
FIG. 6 is a schematic plan view of the base according to embodiment 2 with a crystal resonator piece and an IC chip mounted on the base.

The electrode 5 includes a pair of recognition portions 57 for image recognition in the fabrication process of the crystal oscillator 1. The pair of recognition portions 57 are disposed on the wiring pattern 55 that connects the connection pad 523 to the external terminal 531 and on the wiring pattern 55 that connects the connection pad 524 to the external terminal 532. As shown in FIGS. 6 and 7, the recognition portions 57 are partly exposed in the cavity 44 and formed along the shorter side direction of the base. The recognition portions 57 serve as a mounting basis for mounting the crystal resonator piece 2 and the IC chip 3 on the base 4. This ensures precise mounting of the crystal resonator piece 2 and the IC chip 3 on the base 4. This, as a result, reduces misaligned mounting of the crystal resonator piece 2 and the IC chip 3 on the base 4, and facilitates the attempt to improve productivity, such as improving the yield. The recognition portions 57 are not limited to this embodiment; any other configuration is possible insofar as they are formed in pairs.

A pillow portion 56 for the crystal resonator piece 2 is disposed along and separated from the wiring pattern 55 that connects the connection pad 523 to the external terminal 531. The pillow portion 56 is formed along with the wiring pattern 55. The pillow portion 56 also serves as a portion for recognition, similarly to the recognition portions 57. Specifically, one end edge 561 of the pillow portion 56 and one end edge 5111 of the electrode pad 511 are aligned along the shorter side direction of the base 4, and the other end edge 562 of the pillow portion 56 and an end edge 5121 of the electrode pad 512 are aligned along the shorter side direction of the base 4. The pillow portion 56 and the electrode pads 511 and 512 serve as a mounting basis for mounting the crystal resonator piece 2 and the IC chip 3 on the base 4. This ensures precise mounting of the crystal resonator piece 2 and the IC chip 3 on the base 4. This, as a result, reduces misaligned mounting of the crystal resonator piece 2 and the IC chip 3 on the base 4, and facilitates the attempt to improve productivity, such as improving the yield.

Embodiment 3

Next, the crystal oscillator 1 according to embodiment 3 will be described below by referring to the accompanying drawings. The crystal oscillator 1 according to embodiment 3 is different from embodiment 1 in the base 4. Accordingly, where embodiment 3 has a configuration in common with embodiment 1, the advantageous effects and modifications of the configuration of embodiment 3 are similar to the advantageous effects and the modifications of embodiment 1. In view of this, in embodiment 3, description will be given with regard to the base 4 in different respects from embodiment 1, while the other respects that are shared in common will not be elaborated.

As shown in FIGS. 9 to 12, the electrode 5 of the base 4 includes: a pair of electrode pads 511 and 512 that are electrically and mechanically bonded to the respective excitation electrodes 24 of the crystal resonator piece 2; connection pads 521, 522, 523, 524, 525, and 526 that are electrically connected to respective terminals 31 of the IC chip 3; external terminals 531, 532, 533, and 534 that are to be electrically connected to an external device such as an external circuit board (not shown) with a conductive bonding material such as solder (not shown); and inspection terminals 541 and 542 that measure and inspect the properties of the crystal resonator piece 2.

Figure 11:
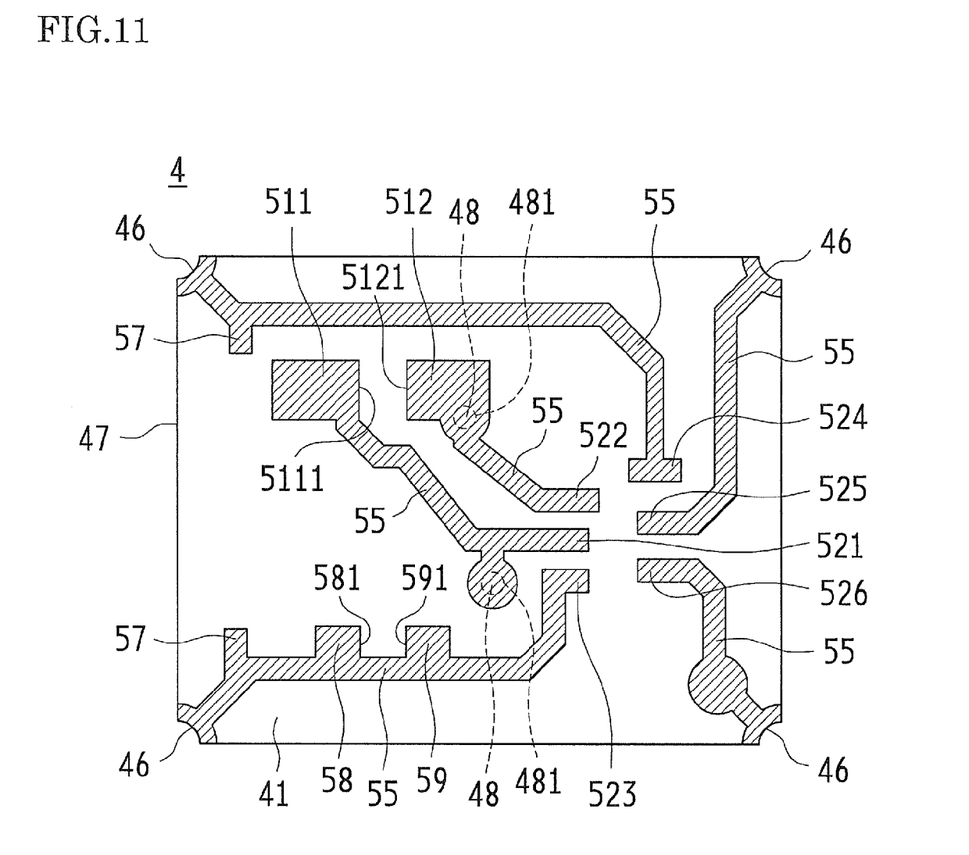
FIG. 11 is a schematic plan view of the base (bottom portion) according to embodiment 3, for illustrating electrode patterns.

The electrode pads 511 and 512 and the connection pads 521, 522, 523, 524, 525, and 526 are disposed on a common plane, on the bottom face 441 of the cavity 44 of the one principal surface 43 of the base 4 (specifically, on the bottom portion 41 of the base 4).

Figure 12:
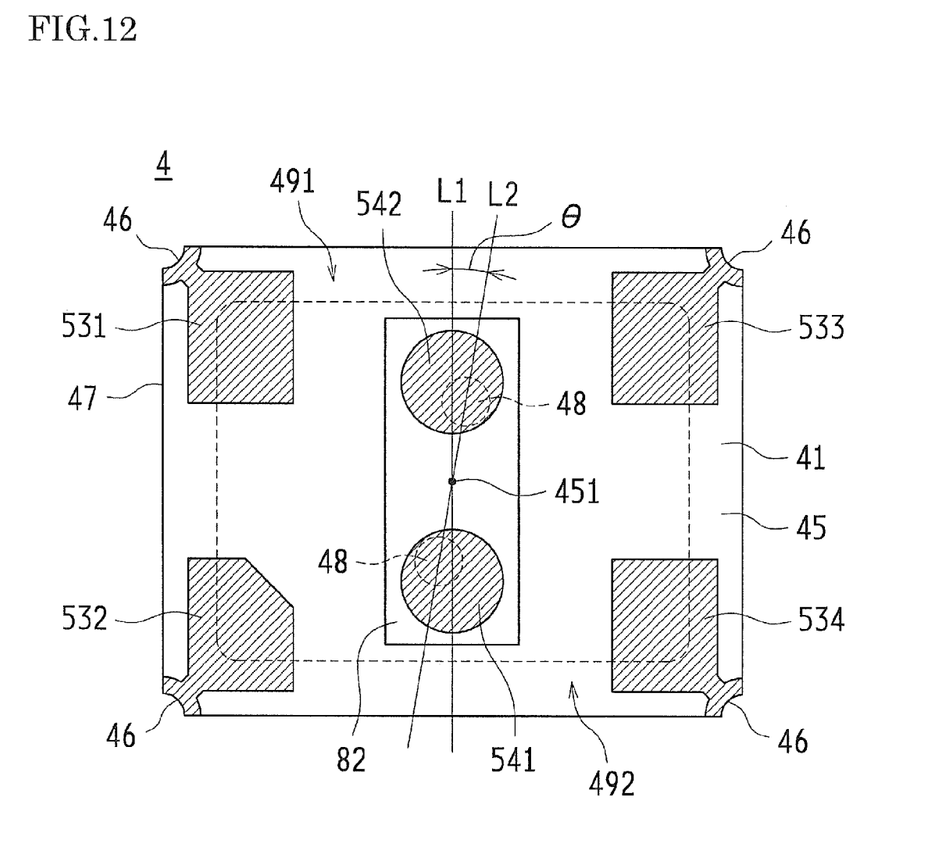
FIG. 12 is a schematic rear view of the base according to embodiment 3.

The external terminals 531, 532, 533, and 534 are disposed in the wall portion corresponding region 491 of the other principal surface 45 (outer periphery of the other principal surface 45), and partly disposed in the cavity corresponding region 492 of the other principal surface 45 (center position with the outer periphery of the other principal surface 45 excluded). Specifically, the external terminals 531, 532, 533, and 534 are disposed on the corners and the castellations 46 of the other principal surface 45. While in this embodiment the external terminals 531, 532, 533, and 534 are partly disposed in the cavity corresponding region 492, this should not be construed in a limiting sense. All that is necessary is that the external terminals 531, 532, 533, and 534 be disposed in the wall portion corresponding region 491 of the other principal surface 45 (the outer periphery of the other principal surface 45). It is also possible to dispose the external terminals 531, 532, 533, and 534 only in the wall portion corresponding region 491 of the other principal surface 45.

Figure 9:
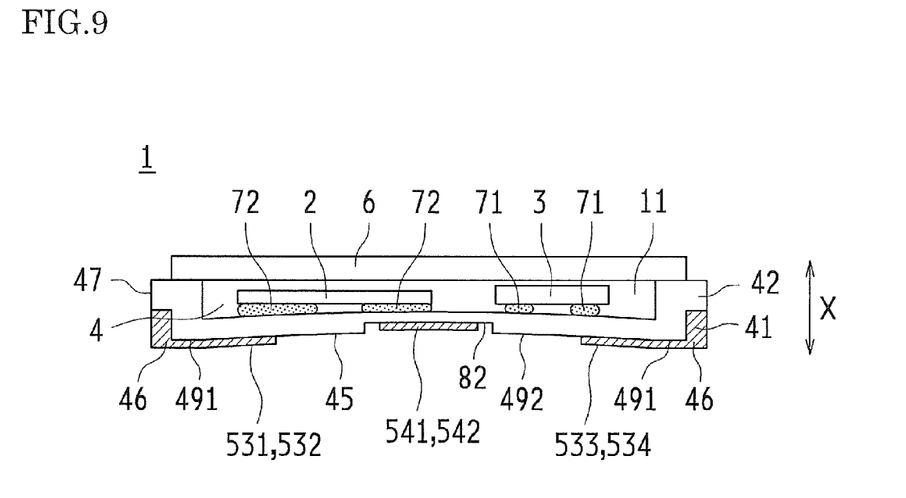
FIG. 9 is a schematic side view of the crystal oscillator according to embodiment 3, for illustrating an internal space of the crystal oscillator.

The inspection terminals 541 and 542 are disposed only in the cavity corresponding region 492 of the other principal surface 45 (center position with the outer periphery of the other principal surface 45 excluded), and are circular shaped in plan view as shown in FIG. 9. Specifically, the inspection terminals 541 and 542 are disposed at a center position of the other principal surface 45 in the longer side direction and disposed side by side along the shorter side direction of the other principal surface 45. Under the inspection terminals 541 and 542, the respective via holes 48 are disposed. Each via hole 48 is deviated from the center of the inspection terminal 541 or 542. The inspection terminals 541 and 542 are disposed in a depressed portion 82 that is formed on the other principal surface 45 of the base 4. The depressed portion 82 ensures that the inspection terminals 541 and 542 are disposed above the external terminals 531, 532, 533, and 534 in the X direction after the fabrication of the crystal oscillator 1. This ensures that at the time of connecting of the external terminals 531, 532, 533, and 534 to a terminal of another electronic device, the inspection terminals 541 and 542 are prevented from contacting the terminal of the other electronic device. Embodiment 3 eliminates the need for the resist processing, as required in embodiment 2 (see FIG. 8). Thus, without the resist processing, embodiment 3 requires one step less than embodiment 2 and thus costs less in providing similar advantageous effects. The depressed portion 82 is not limited to this embodiment; any other shape is possible insofar as the inspection terminals 541 and 542 are disposed in the depressed portion 82.

The electrode pads 511 and 512, the connection pads 521 and 522, and the inspection terminals 541 and 542 in the above-described configuration are electrically connected to each other via the via holes 48 and wiring patterns 55. The connection pads 523, 524, 525, and 526 and the external terminals 531, 532, 533, and 534 are electrically connected to each other via the wiring patterns 55.

Figure 10:
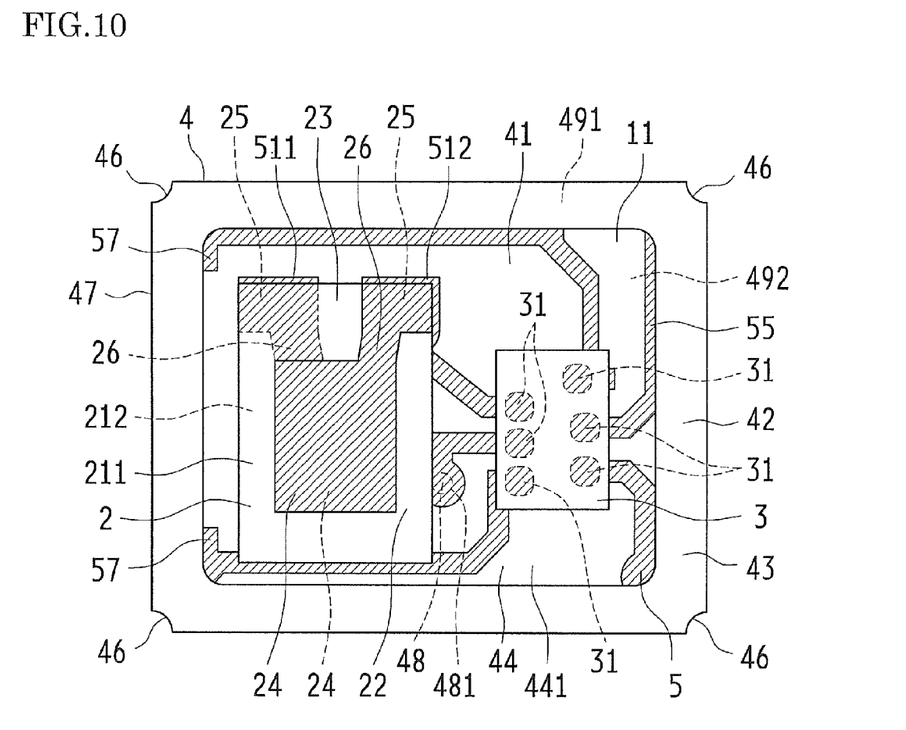
FIG. 10 is a schematic plan view of the base according to embodiment 3 with the crystal resonator piece and the IC chip mounted on the base.

The electrode 5 includes a pair of recognition portions 57 for image recognition in the fabrication process of the crystal oscillator 1. The pair of recognition portions 57 are disposed on the wiring pattern 55 that connects the connection pad 523 to the external terminal 531 and on the wiring pattern 55 that connects the connection pad 524 to the external terminal 532. As shown in FIGS. 10 and 11, the recognition portions 57 are partly exposed in the cavity 44 and formed along the shorter side direction of the base. The recognition portions 57 serve as a mounting basis for mounting the crystal resonator piece 2 and the IC chip 3 on the base 4. This ensures precise mounting of the crystal resonator piece 2 and the IC chip 3 on the base 4. This, as a result, reduces misaligned mounting of the crystal resonator piece 2 and the IC chip 3 on the base 4, and facilitates the attempt to improve productivity, such as improving the yield. The recognition portions 57 are not limited to this embodiment; any other configuration is possible insofar as they are formed in pairs.

The wiring pattern 55 that connects the connection pad 523 to the external terminal 531 includes two pillow portions 58 and 59 dedicated to the crystal resonator piece 2. The pillow portions 58 and 59 are continuous to the wiring pattern 55. The pillow portions 58 and 59 are formed along with the wiring pattern 55. The pillow portions 58 and 59 also serve as portions for recognition, similarly to the recognition portions 57. Specifically, an end edge 581 of one pillow portion 58 and an end edge 5111 of the electrode pad 511 are aligned along the shorter side direction of the base 4, and an end edge 591 of the other pillow portion 59 and an end edge 5121 of the electrode pad 512 are aligned along the shorter side direction of the base 4. The pillow portions 58 and 59 and the electrode pads 511 and 512 serve as a mounting basis for mounting the crystal resonator piece 2 and the IC chip 3 on the base 4. This ensures precise mounting of the crystal resonator piece 2 and the IC chip 3 on the base 4. This, as a result, reduces misaligned mounting of the crystal resonator piece 2 and the IC chip 3 on the base 4, and facilitates the attempt to improve productivity, such as improving the yield.

Figure 13:
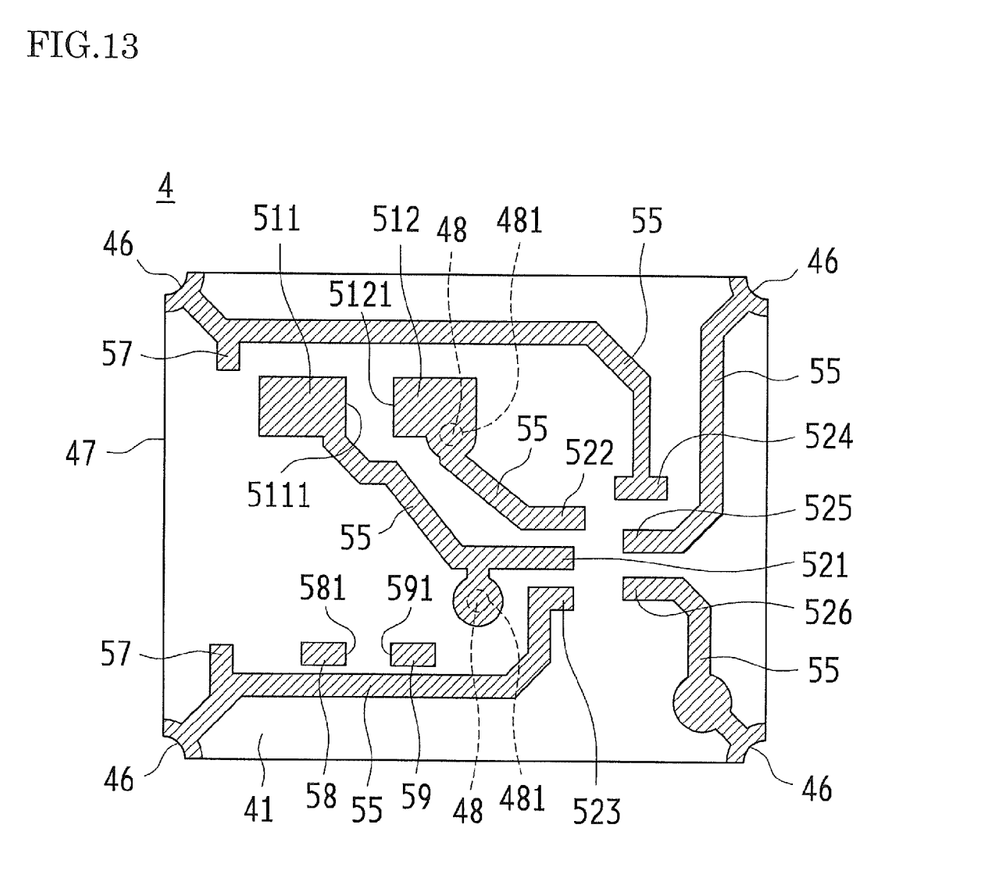
FIG. 13 is a schematic plan view of the base (bottom portion) according to another embodiment, for illustrating electrode patterns.

In this embodiment, on the wiring pattern 55 that connects the connection pad 523 to the external terminal 531, the two pillow portions 58 and 59 dedicated to the crystal resonator piece 2 are disposed in a continuous manner to the wiring pattern 55. This, however, should not be construed in a limiting sense. As shown in FIG. 13, two pillow portions 58 and 59 dedicated to the crystal resonator piece 2 may be disposed along and separated from the wiring pattern 55 that connects the connection pad 523 to the external terminal 531. This provides similar advantageous effects to those of the pillow portions 58 and 59 shown in FIG. 11. Also in this, since the two pillow portions 58 and 59 dedicated to the crystal resonator piece 2 are disposed along and separated from the wiring pattern 55 that connects the connection pad 523 to the external terminal 531, the crystal resonator piece 2 can be held in a separated manner from the wiring pattern 55, thereby preventing a short circuit between the wiring pattern 55 and the excitation electrodes 24.

The present invention can be embodied and practiced in other different forms without departing from the spirit, scope, and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority to Patent Application No. 2010-123239 filed in Japan on May 28, 2010, which is hereby incorporated by reference in its entirety by claiming the priority.

INDUSTRIAL APPLICABILITY

The present invention finds applications in piezoelectric resonator devices such as crystal oscillators.

REFERENCE SIGNS LIST

1 Crystal oscillator (piezoelectric resonator device)
11 Internal space
2 Crystal resonator piece (piezoelectric resonator piece)
211 One principal surface
212 Other principal surface
22 Resonance portion
23 Bonding portion
24 Excitation electrode
25 Terminal electrode
26 Leading-out electrode
3 IC chip (electronic component element)
31 Terminal
4 Base (sealing member)
41 Bottom portion
42 Wall portion
43 One principal surface
44 Cavity
441 Bottom face
45 Other principal surface
451 Center point
46 Castellation
47 Casing side surface
48 Via hole
481 Conducting member
491 Wall portion corresponding region
492 Cavity corresponding region
5 Electrode
511 Electrode pad
5111 End edge
512 Electrode pad
5121 End edge
521, 522, 523, 524, 525, 526 Connection pad
531, 532, 533, 534 External terminal
541, 542 Inspection terminal
55 Wiring pattern
56 Pillow portion
561 One end edge
562 Other end edge
57 Recognition portion
58 Pillow portion
581 End edge
59 Pillow portion
591 End edge
6 Lid (sealing member)
71 Conductive bump
72 Conductive bonding material
81 Insulating portion
82 Depressed portion
L1, L2 Line

The invention claimed is:

1. A sealing member for a piezoelectric resonator device, the piezoelectric resonator device comprising a piezoelectric resonator piece and a plurality of sealing members hermetically sealing a resonance region of the piezoelectric resonator piece,
wherein the sealing member comprises a base material having one principal surface and the base material comprises a protruding portion on the one principal surface,
wherein the base material has another principal surface having a flat surface and a curved surface, the flat surface being a region corresponding to the protruding portion, the curved surface being a region other than the region of the flat surface,
wherein the sealing member comprises a plurality of external terminals on the flat surface, the plurality of external terminals being to be connected to an external circuit board,
wherein the sealing member comprises a plurality of inspection terminals only on the curved surface, the plurality of inspection terminals being configured to inspect the piezoelectric resonator piece,
wherein the base material has a plurality of via holes passing through between both principal surfaces of the base material, and
wherein an alignment of the plurality of via holes is inclined relative to any side of the other principal surface.

2. The sealing member for a piezoelectric resonator device according to claim 1,
wherein the protruding portion is a wall portion, the wall portion being a part defining an outer shape of the sealing member.

3. The sealing member for a piezoelectric resonator device according to claim 1, further comprising an insulating portion comprising an insulating over the inspection terminals.

4. The sealing member for a piezoelectric resonator device according to claim 1, further comprising a pair of recognition portions for image recognition on the one principal surface of the base material, the pair of recognition portions serving as an electrode.

5. The sealing member for a piezoelectric resonator device according to claim 1, further comprising a pillow portion on the one principal surface of the base material, the pillow portion being dedicated to the piezoelectric resonator piece and to image recognition.

6. A piezoelectric resonator device comprising:
the sealing member according to claim 1; and
the piezoelectric resonator piece.

7. The piezoelectric resonator device according to claim 6, further comprising an integrated circuit element on the sealing member,
wherein a gap between the sealing member and the integrated circuit elements is equal to or less than 50 μm, a gap between the sealing member and the piezoelectric resonator piece being larger than the gap between the sealing member and the integrated circuit element.

* * * * *